United States Patent
Itoh et al.

(10) Patent No.: US 9,537,202 B2
(45) Date of Patent: Jan. 3, 2017

(54) BOOSTER ANTENNA AND METHOD FOR PRODUCING SAME

(71) Applicant: DOWA ELECTRONICS MATERIALS CO., LTD., Tokyo (JP)

(72) Inventors: Daisuke Itoh, Okayama (JP); Hidefumi Fujita, Okayama (JP); Yu Murano, Okayama (JP); Shinichi Konno, Okayama (JP)

(73) Assignee: Dowa Electronics Materials Co. Ltd., Tokyo (JP)

( * ) Notice: Subject to any disclaimer, the term of this patent is extended or adjusted under 35 U.S.C. 154(b) by 45 days.

(21) Appl. No.: 14/119,161

(22) PCT Filed: Feb. 1, 2013

(86) PCT No.: PCT/JP2013/052957
§ 371 (c)(1),
(2) Date: Nov. 20, 2013

(87) PCT Pub. No.: WO2013/145879
PCT Pub. Date: Oct. 3, 2013

(65) Prior Publication Data
US 2015/0102964 A1    Apr. 16, 2015

(30) Foreign Application Priority Data
Mar. 29, 2012  (JP) ................. 2012-075551

(51) Int. Cl.
*H01Q 1/38*    (2006.01)
*H01Q 1/36*    (2006.01)
(Continued)

(52) U.S. Cl.
CPC ........ *H01Q 1/364* (2013.01); *G06K 19/07773* (2013.01); *G06K 19/07794* (2013.01);
(Continued)

(58) Field of Classification Search
CPC ..................................................... H01Q 1/364
(Continued)

(56) References Cited

U.S. PATENT DOCUMENTS

| 8,026,851 | B2 | 9/2011 | Itoh et al. |
| 8,673,049 | B2 | 3/2014 | Jablonski et al. |

(Continued)

FOREIGN PATENT DOCUMENTS

| CA | 2759785 A1 | 2/2012 |
| EP | 1879254 A1 | 1/2008 |

(Continued)

OTHER PUBLICATIONS

European Search Report for Application 13770105.8 dated Jul. 10, 2015.

*Primary Examiner* — Graham Smith
(74) *Attorney, Agent, or Firm* — Bachman & LaPointe, PC

(57) ABSTRACT

A silver particle dispersing solution, which contains 50-70% by weight of silver particles having an average particle diameter of 20 nm or less, is applied on a substrate by the flexographic printing, and then, calcined to produce a booster antenna wherein a silver conductive film, which contains 10-50% by volume of a sintered body of the silver particles and which has a volume resistivity of 3-100 μΩ·cm, a surface resistivity of 0.5Ω/□ or less and a thickness of 1-6 μm, is formed on the substrate. Thus, there is provided a booster antenna which has excellent electrical characteristics and flexibility and which can be inexpensively mass-produced.

5 Claims, 3 Drawing Sheets

(51) Int. Cl.
  *G06K 19/077* (2006.01)
  *H01Q 1/22* (2006.01)
  *H05K 1/09* (2006.01)
  *H01Q 9/04* (2006.01)
  *H05K 1/16* (2006.01)
  *H05K 3/12* (2006.01)

(52) U.S. Cl.
  CPC ............ *H01Q 1/2225* (2013.01); *H01Q 1/38* (2013.01); *H01Q 9/0407* (2013.01); *H05K 1/097* (2013.01); *H05K 1/165* (2013.01); *H05K 3/1275* (2013.01); *H05K 2201/10098* (2013.01); *Y10T 29/49016* (2015.01)

(58) Field of Classification Search
  USPC ................................................ 343/700 MS
  See application file for complete search history.

(56) References Cited

U.S. PATENT DOCUMENTS 8,872,331 B2 10/2014 Yamazaki et al.
8,916,068 B2 12/2014 Sato et al.

FOREIGN PATENT DOCUMENTS

| EP | 2019425 A1 | 1/2009 |
| EP | 2233230 A1 | 9/2010 |
| JP | 2008041005 A | 2/2008 |
| JP | 2009088340 A | 4/2009 |
| JP | 2010268073 A | 11/2010 |
| WO | 2006103981 A1 | 10/2006 |

(a)

(b)

BOOSTER ANTENNA AND METHOD FOR PRODUCING SAME

TECHNICAL FIELD

The present invention relates generally to a booster antenna and a method for producing the same. More specifically, the present invention relates to a booster antenna for an RFEI tag and a method for producing the same.

BACKGROUND ART

RFID tags utilize the RFID (Radio Frequency Identification (Identification Technique based on Radio Communication)), and are thin, light and small electronic devices, each of which has a semiconductor chip for storing data, such as an identification number, and an antenna for transmitting and receiving radio waves.

Such RFID tags are expected to be widely utilized in various service environments in various fields, such as physical distribution management, and are desired to be mass-produced to reduce the production costs thereof to be spread. Antennas for RFID tags are required to have a low electrical resistance in order to increase the data transmittable/receivable range (communication range) thereof to reduce data loss during transmit/receive. Moreover, RFID tags are used in various fields, such as physical distribution management (e.g., management of tracking of shipping containers, traceability and positional information, and management of closing by laundry, such as laundry tags), so that they are often repeatedly bent in service environment. Therefore, even if RFID tags are repeatedly bent, it is required to prevent them from being unserviceable as RFID tags by the deterioration of characteristics of antennas, such as breaking and increasing of electrical resistance due to metal fatigue of antennas, so that they are required to have good flexibility.

As methods for forming antenna circuits (conductive circuits) for RFID tags, there are a method for utilizing a copper coil or wire as an antenna, a method for transferring a metal foil, such a copper or aluminum foil, to a substrate, a method for printing an etching resistant ink as an antenna circuit pattern on a metal foil, which is laminated on a substrate such as a plastic film, to mask it to etch the metal foil, and so forth.

However, since these methods are not suit for mass production due to the limitation of their productivity, it is difficult to further reduce the production costs. In the method for transferring a metal foil to a substrate and in the method for etching a metal foil among the above-described methods, the metal foil is produced by rolling or the like, and the percentage of a metal in the metal foil is a high percentage which is approximately 100%. For that reason, there is a problem in that an RFID tag having an antenna circuit formed by a metal foil has bad flexibility although it has good electrical characteristics. In addition, although a metal foil having a thickness of about 10 to 50 μm is generally used for forming an antenna circuit for an RFID tag, if the metal foil is too thick, the characteristics of the metal foil approach those of a metal plate for deteriorating the adhesion thereof to a substrate, so that there is some possibility that the metal foil may be stripped from the substrate when the RFID tag is bent. Moreover, since the percentage of the metal in the metal foil is high, when RFID tag is bent, stress concentrates on the bent surface thereof, so that cracks are easy to be generated on the bent surface thereof. As a result, the electrical characteristics thereof are deteriorated, and the breaking thereof is caused, so that it does not function as an antenna for an RFID tag. On the other hand, if the percentage of a metal is decreased by using a conductive film of the metal component and a resin component in place of the metal foil in order to improve the flexibility of the RFID tag, it is possible to generally improve the flexibility by stress relaxation, but the amount of the metal component is decreased for deteriorating the electrical characteristics thereof, so that it does not have sufficient characteristics as those of an antenna for an RFID tag.

As a method for producing an antenna for an RFID tag wherein a conductive circuit is formed on a substrate so as to have good adhesion thereto without the use of any metal foils, there is proposed a method for applying a water based conductive ink containing 40% or less by weight of silver particles on the surface of a film substrate by the flexographic printing to dry the ink to form a conductive film having a thickness of 0.1 to 0.5 μm on the surface of the film substrate to produce an antenna for an IC tag which is one kind of RFID tag (see, e.g., Japanese Patent Laid-Open No. 2010-268073).

In the method disclosed in Japanese Patent Laid-Open No. 2010-268073, it is possible to mass-produce antennas for IC tags, which have a low electrical resistance, to reduce the production costs thereof. However, the conductive ink containing the small amount of silver particles is used for forming the thin conductive film having the thickness of 0.1 to 0.5 μm, and the percentage of silver in the conductive film is a high percentage which is approximately 100%, so that there is a problem in that the flexibility of the tag is bad similar to that in the method for transferring a metal foil to a substrate and in the method for etching a metal foil.

In an RFID tag chip integrated with an antenna, there is a problem in that the communication range thereof is short, so that it is desired to increase the communication range thereof. For that reason, it is desired to increase the communication range thereof by mounting a booster antenna on an RFID tag chip integrated with an antenna, the booster antenna being formed so as to be electromagnetically coupled to the antenna of the RFID tag chip.

However, when the booster antenna is mounted on the RFID tag chip, it is required to mount thereon the booster antenna, which has excellent electrical characteristics and flexibility and which can be inexpensively mass-produced, similar to the antenna integrated with the RFID tag chip.

DISCLOSURE OF THE INVENTION

It is therefore an object of the present invention to eliminate the aforementioned conventional problems and to provide a booster antenna, which has excellent electrical characteristics and flexibility and which can be inexpensively mass-produced, and a method for producing the same.

In order to accomplish the aforementioned object, the inventors have diligently studied and found that it is possible to produce a booster antenna, which has excellent electrical characteristics and flexibility and which can be inexpensively mass-produced, if there is produced a booster antenna which has a silver conductive film formed on a substrate, the silver conductive film containing 10-50% by volume of a sintered body of silver particles and having a volume resistivity of 3-100 μΩ·cm. Thus, the inventors have made the present invention.

According to the present invention, a booster antenna comprises: a substrate; and a silver conductive film formed on the substrate, the silver conductive film containing 10-50% by volume of a sintered body of silver particles and having a volume resistivity of 3-100 μΩ·cm. This booster antenna preferably has a surface resistivity of 0.5Ω/☐ or less and a thickness of 1-6 μm.

According to the present invention, there is provided a method for producing a booster antenna, the method comprising the steps of: preparing a silver particle dispersing solution which contains 50-70% by weight of silver particles; applying the silver particle dispersing solution on a substrate; and calcining the silver particle dispersing solution on the substrate to form the above-described silver conductive film. In this method for producing a booster antenna, the applying of the silver particle dispersing solution on the substrate is preferably carried out by the flexographic printing, and the silver particles preferably have an average particle diameter of 20 nm or less.

Throughout the specification, the expression "the average particle diameter of silver particles" means an average primary particle diameter which is an average value of primary particle diameters of silver particles based on a transmission electron microphotograph (TEM image).

According to the present invention, it is possible to produce a booster antenna which has excellent electrical characteristics and flexibility and which can be inexpensively mass-produced.

BEST MODE FOR CARRYING OUT THE INVENTION

Figure 1:
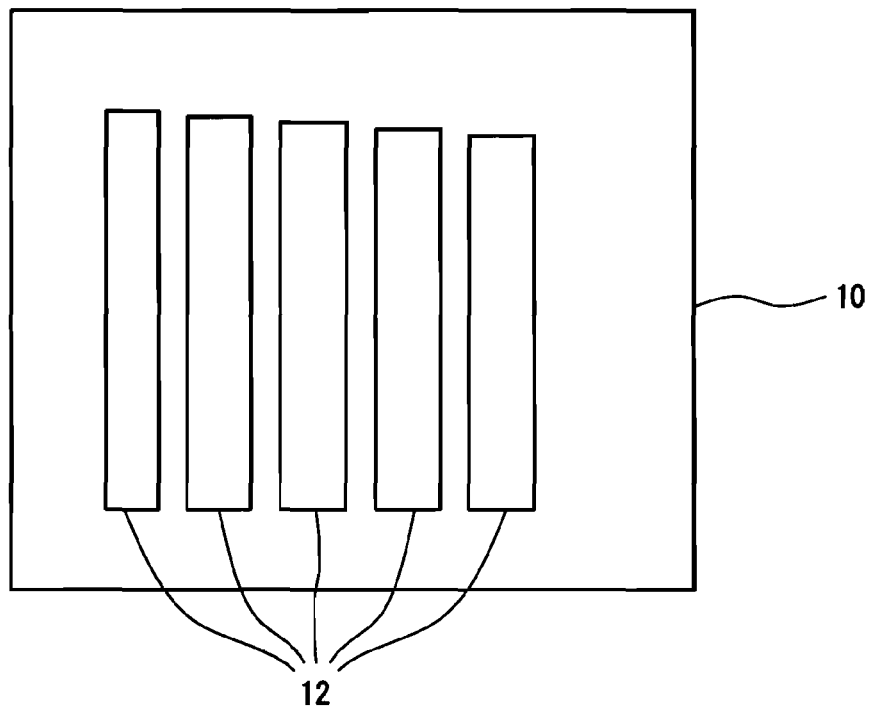
FIG. 1 is a view for explaining the shape of an Ag ink printed on a substrate in Examples and Comparative Examples.

In the preferred embodiment of a booster antenna according to the present invention, a silver conductive film is formed on a substrate, the silver conductive film containing 10-50% by volume of a sintered body of silver particles and having a volume resistivity of 3-100 μΩ·cm. If the amount of the sintered body of silver particles in the silver conductive film is less than 10% by volume, it is too small, so that the electrical characteristics thereof are deteriorated. Thus, when the booster antenna is used for an RFID tag, it does not function as a booster antenna. On the other hand, if the amount of the sintered body of silver particles in the silver conductive film exceeds 50% by volume, when the booster antenna is used for an RFID tag and when the RFID tag is bent, stress concentrates on the bent surface thereof, so that cracks are easy to be generated on the bent surface thereof. As a result, the deterioration of electrical characteristics thereof and the breaking thereof are easy to be caused, so that there is increased the possibility that it does not function as a booster antenna. If the volume resistivity of the silver conductive film is in the range of from 3μΩ·cm to 100 μΩ·cm, when the booster antenna is used for an RFID tag, the communication range thereof can be increased to ensure the transmit/receive of data of the RFID tag between the booster antenna and a reader/writer, so that it is difficult for the booster antenna to cause data loss during transmit/receive.

The surface resistivity of the silver conductive film is preferably 0.5Ω/☐ or less. If the surface resistivity of the silver conductive film is 0.5Ω/☐ or less, when the booster antenna is used for an RFID tag, the communication range thereof can be increased to ensure the transmit/receive of data of the RFID tag between the booster antenna and a reader/writer, so that it is difficult for the booster antenna to cause data loss during transmit/receive.

The thickness of the silver conductive film is preferably in the range of from 1 μm to 6 μm. As the silver conductive film is thinner, the costs thereof are lower. However, if it is less than 1 μm, when the booster antenna is used for an RFID tag, the electrical resistance thereof in the UHF band is increased due to conductor skin effect, so that the communication range thereof is decreased.

In the preferred embodiment of a method for producing a booster antenna according to the present invention, the above-described silver conductive film is formed by calcining a silver particle dispersing solution, which contains 50-70% by weight of silver particles, after applying the silver particle dispersing solution on a substrate. If the content of the silver particles in the silver particle dispersing solution is less than 50% by weight, it is difficult to form the above-described silver conductive film on the substrate, and the electrical conductivity of the film is deteriorated to increase the electrical resistance thereof since the amount of the sintered body of silver particles in the silver conductive film is too small. If the content of the silver particles exceeds 70% by weight, the viscosity of the silver particle dispersing solution is increased, so that it is difficult to apply it on the substrate by the flexographic printing or the like.

In this method for producing a booster antenna, the applying of the silver particle dispersing solution on the substrate is preferably carried out by the flexographic printing. The flexographic printing may be repeated. The average particle diameter of the silver particles is preferably 20 nm or less, and more preferably in the range of from 5 μm to 15 μm. If the average particle diameter of the silver particles is in the range of from about a few nanometers to about over ten nanometers, the specific surface area thereof increases, so that the melting point thereof dramatically decreases. For that reason, even if the silver particles are calcined at a low temperature of not higher than 300° C., it is possible to sinter the silver particles with each other (that is, it is possible to obtain the degree of sintering at a low temperature). However, if the average particle diameter of the silver particles is greater than 20 nm, it is difficult to obtain the degree of sintering at a low temperature, which is expected as silver nanoparticles (fine silver particles).

Furthermore, the average particle diameter (average primary particle diameter) of the silver particles can be calculated as follows. For example, the silver particles are added to a mixed solution of 2 parts by weight of an Ag ink containing silver particles, such as an Ag ink (PFI-700 produced by PChem Associates Inc.), which contains 60% by weight of Ag particles (silver particles having an average particle diameter of 10 nm), 3.0% by weight of polyvinyl chloride copolymer latex, 2.0% by weight of polyurethane thickener and 2.5% by weight of polypropylene glycol, 96 parts by weight of cyclohexane and 2 parts by weight of oleic acid, and are dispersed by ultrasonic. Then, the fluid dispersion thus obtained is allowed to drop onto a Cu microgrid having a supporting film to be dried. Then, an image obtained by observing the silver particles on the microgrid in a bright field at an accelerating voltage of 100 kV by means of a transmission electron microscope (JEM-100 CX Mark-II produced by Japan Electron Optics Laboratory Ltd.) is taken at a magnification of 300,000. From the TEM image thus obtained, the average particle diameter (average primary particle diameter) of the silver particles can be calculated. The calculation of the average primary particle diameter of the silver particles can be carried out by, e.g., an image analysis software (A-image-kun (registered trademark) produced by Asahi Kasei Engineering Corporation). This image analysis software is designed to identify and analyze each of particles with the gradation of color. For example, with respect to the TEM image having the magnification of 300,000, a circular particle analysis is carried out on such conditions that "the brightness of particles" is set to be "dark", "the noise removing filter" is used, "the circular threshold value" is set to be "20", and "the overlapping degree" is set to be "50". Thus, the primary particle diameters of 200 or more of particles are measured, and the number average diameter thereof can be obtained as the average primary particle diameter. If the TEM image has a large number of sintered particles and deformed particles, it may be impossible measurement (no measured).

Examples of a booster antenna and a method for producing the same according to the present invention will be described below in detail.

Examples 1-4

First, there was prepared an Ag ink (PFI-700 produced by PChem Associates Inc.) containing 60% by weight of Ag particles (silver particles having an average particle diameter of 10 nm), 3.0% by weight of polyvinyl chloride copolymer latex, 2.0% by weight of polyurethane thickener and 2.5% by weight of propylene glycol.

Then, a flexographic printing machine (multipurpose fine printing machine JEM Flex produced by Nihon Denshi Seiki Co., Ltd.) and a flexographic printing plate (produced by Watanabe Gosando Co., Ltd., Material of Printing Plate: Photosensitive Resin Plate AWP produced by Asahi Kasei Corporation, Grade DEF, Surface Processing 150 lines, 96 DOT %) were used for printing the above-described Ag ink on a substrate (PET (polyethylene terephthalate) film, Melinex (registered trademark) 545 produced by DuPont Teijin Films Limited) 10 at an anilox volume of 8 cc/m$^2$ (400 lines/inch) and at a printing speed of 20 m/min. once (Example 1), twice (Example 2), three times (Example 3) and four times (Example 4) as the number of printing times, respectively, so as to form five films 12 having a substantially rectangular shape having a size of about 3 cm×15 cm as shown in FIG. 1, and then, the printed matter was heat-treated on a hot plate at 140° C. for 30 minutes to be calcined to obtain a conductive film (silver conductive film).

Figure 2A:
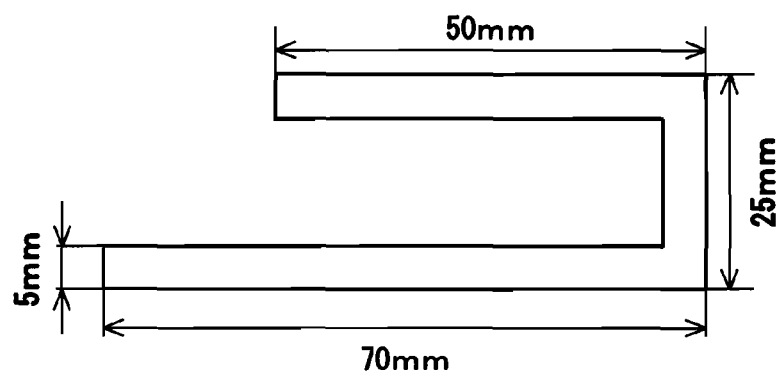
FIG. 2A is a view showing the shape of a booster antenna produced by using a conductive film produced in Examples and Comparative Examples.
Figure 2:
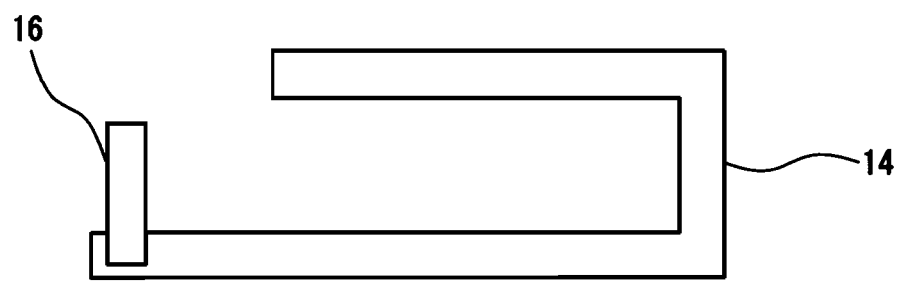
FIG. 2B is a view showing the state that an RFID tag chip is mounted on the booster antenna of FIG. 2A.

Then, after the produced conductive film, together with the substrate, was cut in a substantially J-shape shown in FIG. 2A to be applied on a pressure sensitive adhesive release film (Type PET 38 produced by Lintec Corporation) to produce a booster antenna 14 as shown in FIG. 2B, an RFID tag chip (Trap Monza 3 produced by Impinj, Inc.) 16 (having an antenna integrated therewith) was mounted on the booster antenna 14 (so that the booster antenna 14 was electromagnetically coupled to the antenna of the RFID tag chip 16).

With respect to the RFID tag chip-mounted booster antenna thus produced, the thickness, electrical resistance (line resistance) and surface resistivity of the conductive film were measured, and the volume resistivity of the conductive film and the percentage of the metal (Ag) in the conductive film were calculated.

The thickness of the conductive film was obtained by measuring a difference of elevation at each of 100 points between the surface of the substrate, on which the conductive film was formed, and the surface of the conductive film by means of a laser microscope (Model VK-9700 produced by KEYENCE CORPORATION) to calculate an average value thereof. As a result, the thickness of the conductive film was 1.4 μm (Example 1), 2.1 μm (Example 2), 3.0 μm (Example 3) and 3.6 μm (Example 4), respectively.

The electrical resistance (line resistance) of the conductive film was obtained by measuring the electrical resistance in longitudinal directions of the longest linear portion (a rectangular portion having a size of 5.0 mm×70 mm) of one conductive film of the booster antenna by means of a tester (Model CDM-03D produced by CUSTOM Corporation). As a result, the electrical resistance of the conductive film was 7.7Ω (Example 1), 1.8Ω (Example 2), 1.2 Ω (Example 3) and 0.8Ω (Example 4), respectively.

A piece having a size of 2.0 cm×2.0 cm was cut out of the conductive film for measuring the surface resistivity of the conductive film by the four-terminal method by means of a surface resistivity measuring apparatus (Loresta GP produced by Mitsubishi Chemical Analytech Co., Ltd.). As a result, the surface resistivity of the conductive film was 0.25Ω/□ (Example 1), 0.06Ω/□ (Example 2), 0.03Ω/□ (Example 3) and 0.02Ω/□ (Example 4), respectively.

The volume resistivity of the conductive film was derived from the thickness, electrical resistance and area (the area formed on the surface of the substrate) of the conductive film. As a result, the volume resistivity of the conductive film was 44.6 μΩ·cm (Example 1), 17.4 μΩ·cm (Example 2), 15.3 μΩ·cm (Example 3) and 13.6 μΩ·cm (Example 4), respectively.

The percentage of the metal (Ag) in the conductive film was obtained as follows. First, the conductive film having a printed area of 2.6 cm×13.1 cm was dissolved in a concentrated nitric acid solution (having a known weight), and the concentration of Ag in the solution was obtained by the inductively coupled plasma (ICP) emission spectral analysis method to calculate the weight (g) of Ag in the conductive film. Then, the volume (cm$^3$) of Ag was derived from the density (10.5 g/cm$^3$) of Ag, and the volume of the conductive film was derived from the thickness and printed area (2.6 cm×13.1 cm) of the conductive film to calculate the percentage of Ag in the conductive film from the expression "volume (cm$^3$) of Ag×100/volume (cm$^3$) of conductive film". As a result, the percentage of Ag in the conductive film was 22.4% by volume (Example 1), 31.0% by volume (Example 2), 37.1% by volume (Example 3) and 48.3% by volume (Example 4), respectively.

With respective to the produced RFID tag chip-mounted booster antenna, the communication range (theoretical read range forward) at a frequency domain of 800 to 1100 MHz (based on ISO/IEC 18000-6C Standard) was measured by a communication range measuring apparatus (tagformance produced by Voyantic Corporation) in an electromagnetic anechoic box (MY1530 produced by Micronics Corporation). Furthermore, prior to this measurement, environment setting (setting by a reference tag attached to tagformance) on this condition was carried out. As a result, the communication range at a frequency of 955 MHz was 3.2 m (Example 1), 4.0 m (Example 2), 4.2 m (Example 3) and 4.0 m (Example 4), respectively.

Figure 3:
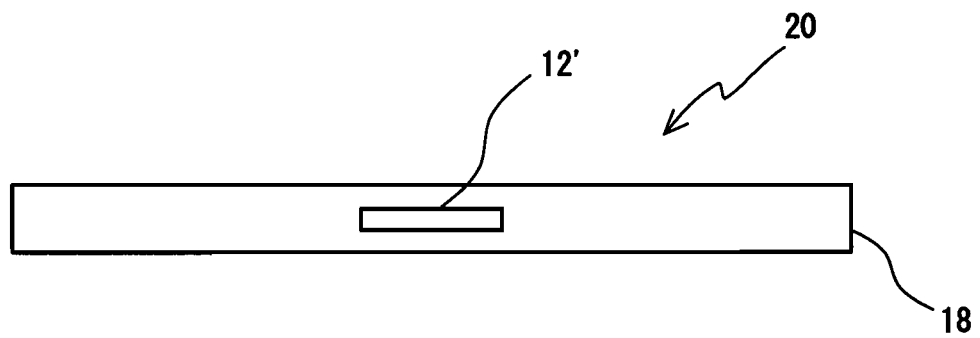
FIG. 3 is a schematic view showing a bending test sample used in Examples and Comparative Examples.
Figure 4:
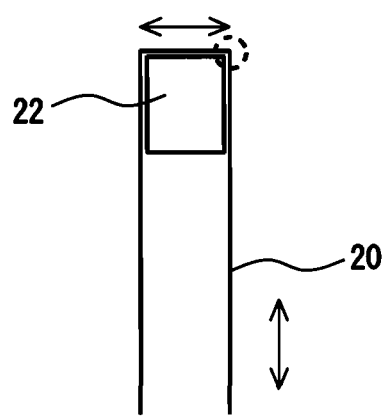
FIG. 4 is a view for explaining a bending test carried out in Examples and Comparative Examples, wherein (b) is an enlarged view schematically showing a portion of the bending test sample surrounded by a circular dotted line.
Figure 4:
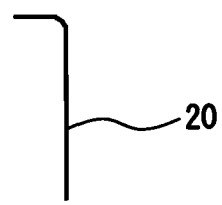

As shown in FIG. 3, a rectangular conductive film 12' having a size of 5.0 mm×20.0 mm was cut out of the conductive film produced in this example, to be applied on a pressure sensitive adhesive release film (Type PET 38 produced by Lintec Corporation) 18 to produce a bending test sample 20. As shown in FIG. 4, the conductive film 12' of the bending test sample 20 was pressed at 5.0 N on a pole 22 of iron having R=0.5 mm to be caused to slide in directions of the arrow by 10 cm while being bent by 90 degrees. After this sliding movement was repeated 10 times, 100 times and 500 times, respectively, the line resistance (tester) was measured to obtain a resistance deteriorated rate (100% when the line resistance is not changed) from the expression (line resistance after sliding movement×100/line resistance before test). As a result, in Examples 1 and 2, the resistance deteriorated rate was 100% after the sliding movement was repeated 10 times, 100 times and 500 times, respectively. In Example 3, the resistance deteriorated rate was 100% after the sliding movement was repeated 10 times and 100 times, respectively, and 125% after it was repeated 500 times. In Example 4, the resistance deteriorated rate was 100% after the sliding movement was repeated 10 times, 150% after it was repeated 100 times, and 180% after it was repeated 500 times.

The conditions and results in Examples 1-4 are shown in Tables 1-3.

TABLE 1

| | Film Forming Method | Concentration of Ag in Ink (wt. %) | Printing Conditions | |
|---|---|---|---|---|
| | | | Anilox Volume (cc/m$^2$) | Number of Printing Times |
| Ex. 1 | Print | 60 | 8 | 1 |
| Ex. 2 | Print | 60 | 8 | 2 |
| Ex. 3 | Print | 60 | 8 | 3 |
| Ex. 4 | Print | 60 | 8 | 4 |
| Comp. 1 | Print | 50 | 8 | 1 |
| Ex. 5 | Print | 50 | 8 | 2 |
| Ex. 6 | Print | 50 | 8 | 3 |
| Ex. 7 | Print | 50 | 8 | 4 |
| Ex. 8 | Print | 70 | 8 | 1 |
| Ex. 9 | Print | 70 | 8 | 2 |
| Ex. 10 | Print | 70 | 8 | 3 |
| Comp. 2 | Print | 70 | 8 | 4 |
| Ex. 11 | Print | 60 | 20 | 1 |
| Ex. 12 | Print | 60 | 20 | 2 |
| Ex. 13 | Print | 60 | 20 | 3 |
| Comp. 3 | Print | 60 | 20 | 4 |
| Comp. 4 | Print | 60 | 20 | 8 |
| Comp. 5 | Print | 40 | 8 | 1 |
| Comp. 6 | Print | 40 | 8 | 2 |
| Comp. 7 | Print | 40 | 8 | 3 |
| Comp. 8 | Print | 40 | 8 | 4 |
| Comp. 9 | Foil | — | — | — |
| Comp. 10 | Foil | — | — | — |
| Comp. 11 | Foil | — | — | — |
| Comp. 12 | Foil | — | — | — |
| Comp. 13 | Foil | — | — | — |

TABLE 2

| | Thickness (μm) | Electrical Resistance (Ω) | Surface Resistivity (Ω/□) | Volume Resistivity (μΩ·cm) | Percentage of Metal (vol. %) |
|---|---|---|---|---|---|
| Ex. 1 | 1.4 | 7.7 | 0.25 | 44.6 | 22.4 |
| Ex. 2 | 2.1 | 1.8 | 0.06 | 17.4 | 31.0 |
| Ex. 3 | 3.0 | 1.2 | 0.03 | 15.3 | 37.1 |
| Ex. 4 | 3.6 | 0.8 | 0.02 | 13.6 | 48.3 |
| Comp. 1 | 1.7 | OL | OL | OL | 8.5 |
| Ex. 5 | 2.5 | 8.9 | 0.43 | 78.7 | 15.5 |
| Ex. 6 | 3.4 | 3.9 | 0.18 | 53.5 | 17.5 |
| Ex. 7 | 4.8 | 2.8 | 0.10 | 46.1 | 18.8 |
| Ex. 8 | 1.7 | 5.5 | 0.19 | 32.8 | 25.6 |
| Ex. 9 | 2.5 | 1.8 | 0.06 | 17.4 | 32.7 |
| Ex. 10 | 2.8 | 1.0 | 0.03 | 10.8 | 43.3 |
| Comp. 2 | 3.1 | 0.6 | 0.01 | 7.9 | 54.7 |
| Ex. 11 | 2.2 | 1.6 | 0.06 | 15.4 | 28.5 |
| Ex. 12 | 3.6 | 0.9 | 0.02 | 11.5 | 38.5 |
| Ex. 13 | 5.6 | 0.2 | 0.01 | 3.6 | 49.2 |
| Comp. 3 | 7.5 | 0.2 | 0.01 | 4.8 | 54.9 |
| Comp. 4 | 11.4 | 0.2 | 0.01 | 7.3 | 70.1 |
| Comp. 5 | 1.5 | OL | OL | OL | 5.7 |
| Comp. 6 | 2.4 | 820.0 | 114.0 | 4280 | 6.4 |
| Comp. 7 | 3.6 | 185.0 | 35.5 | 1705 | 5.9 |
| Comp. 8 | 5.0 | 70.0 | 7.4 | 1140 | 7.0 |
| Comp. 9 | 1.0 | 0.3 | 0.01 | 1.6 | 100 |
| Comp. 10 | 3.0 | 0.2 | 0.01 | 1.9 | 100 |
| Comp. 11 | 3.0 | 0.3 | 0.01 | 3.8 | 100 |
| Comp. 12 | 6.0 | 0.2 | 0.01 | 7.6 | 100 |
| Comp. 13 | 12.0 | 0.2 | 0.01 | 15.3 | 100 |

TABLE 3

| | Flexibility (Resistance Deteriorated Rate) (%) | | | Communication Range (m) |
|---|---|---|---|---|
| | 10 times | 100 times | 500 times | |
| Ex. 1 | 100 | 100 | 100 | 3.2 |
| Ex. 2 | 100 | 100 | 100 | 4.0 |
| Ex. 3 | 100 | 100 | 125 | 4.2 |
| Ex. 4 | 100 | 150 | 180 | 4.0 |
| Comp. 1 | No Measured | No Measured | No Measured | 0.0 |
| Ex. 5 | 100 | 100 | 100 | 2.7 |
| Ex. 6 | 100 | 100 | 100 | 3.5 |
| Ex. 7 | 100 | 100 | 100 | 3.4 |
| Ex. 8 | 100 | 100 | 100 | 3.6 |
| Ex. 9 | 100 | 100 | 120 | 4.0 |
| Ex. 10 | 100 | 110 | 150 | 4.0 |
| Comp. 2 | 100 | 350 | 1200 | 4.2 |
| Ex. 11 | 100 | 100 | 100 | 3.8 |
| Ex. 12 | 100 | 100 | 125 | 4.1 |
| Ex. 13 | 100 | 150 | 180 | 4.2 |
| Comp. 3 | 200 | 400 | 1400 | 4.2 |
| Comp. 4 | Breaking | Breaking | Breaking | 4.2 |
| Comp. 5 | No Measured | No Measured | No Measured | 0.0 |
| Comp. 6 | 100 | 100 | 100 | 0.0 |
| Comp. 7 | 100 | 100 | 100 | 0.7 |
| Comp. 8 | 100 | 100 | 100 | 1.8 |
| Comp. 9 | 100 | 200 | 800 | 3.8 |
| Comp. 10 | 100 | 150 | 400 | 4.2 |
| Comp. 11 | 167 | 633 | Breaking | 4.2 |
| Comp. 12 | 100 | 100 | 1200 | 4.0 |
| Comp. 13 | 100 | 100 | 800 | 4.2 |

Comparative Example 1

Examples 5-7

First, polyvinyl chloride copolymer latex, polyurethane thickener and propylene glycol were added to the Ag ink used in Examples 1-4, to prepare an Ag ink containing 50% by weight of Ag particles (silver particles having an average particle diameter of 10 nm), 18.4% by weight of polyvinyl chloride copolymer latex, 2.0% by weight of polyurethane thickener and 2.5% by weight of propylene glycol.

By the same method as that in Examples 1-4 except that the Ag ink thus prepared was used to be printed once (Comparative Example 1), twice (Example 5), three times (Example 6) and four times (Example 7), respectively, a conductive film was obtained, and then, an RFID tag chip-mounted booster antenna and a bending test sample were produced. Then, by the same method as that in Examples 1-4, the thickness, electrical resistance and surface resistivity of the conductive film were measured, and the volume resistivity of the conductive film and the percentage of Ag in the conductive film were calculated. Also, by the same method as that in Examples 1-4, the communication range of the RFID tag chip-mounted booster antenna was measured, and the resistance deteriorated rate of the bending test sample was obtained.

As a result, the thickness of the conductive film was 1.7 µm (Comparative Example 1), 2.5 µm (Example 5), 3.4 µm (Example 6) and 4.8 µm (Example 7), respectively. The electrical resistance of the conductive film was not able to be measured due to overload (OL) (Comparative Example 1), 8.9Ω (Example 5), 3.9Ω (Example 6) and 2.8 Ω (Example 7), respectively. The surface resistivity of the conductive film was not able to be measured due to overload (OL) (Comparative Example 1), 0.43Ω/□ (Example 5), 0.18Ω/□ (Example 6) and 0.10Ω/□ (Example 7), respectively. The volume resistivity of the conductive film was not able to be calculated due to overload (OL) (Comparative Example 1), 78.7 µΩ·cm (Example 5), 53.5 µΩ·cm (Example 6) and 46.1 µΩ·cm (Example 7), respectively. The percentage of Ag in the conductive film was 8.5% by volume (Comparative Example 1), 15.5% by volume (Example 5), 17.5% by volume (Example 6) and 18.8% by volume (Example 7), respectively. The communication range at a frequency of 955 MHz was 0.0 m (Comparative Example 1), 2.7 m (Example 5), 3.5 m (Example 6) and 3.4 m (Example 7), respectively. The resistance deteriorated rate was not able to be calculated due to overload (OL) in Comparative Example 1. In Examples 5-7, the resistance deteriorated rate was 100% after the sliding movement was repeated 10 times, 100 times and 500 times, respectively.

The conditions and results in Examples 5-7 and Comparative Example 1 are shown in Tables 1-3.

Examples 8-10

Comparative Example 2

First, after the Ag ink used in Examples 1-4 was centrifuged at 3000 rpm for 10 minutes, the supernatant liquid was removed to prepare an Ag ink wherein the concentration of Ag particles was adjusted to be 70% by weight.

By the same method as that in Examples 1-4 except that the Ag ink thus prepared was used to be printed once (Example 8), twice (Example 9), three times (Example 10) and four times (Comparative Example 2), respectively, a conductive film was obtained, and then, an RFID tag chip-mounted booster antenna and a bending test sample were produced. Then, by the same method as that in Examples 1-4, the thickness, electrical resistance and surface resistivity of the conductive film were measured, and the volume resistivity of the conductive film and the percentage of Ag in the conductive film were calculated. Also, by the same method as that in Examples 1-4, the communication range of the RFID tag chip-mounted booster antenna was measured, and the resistance deteriorated rate of the bending test sample was obtained.

As a result, the thickness of the conductive film was 1.7 µm (Example 8), 2.5 µm (Example 9), 2.8 µm (Example 10) and 3.1 µm (Comparative Example 2), respectively. The electrical resistance of the conductive film was 5.5 Ω (Example 8), 1.8 Ω (Example 9), 1.0 Ω (Example 10) and 0.6 Ω (Comparative Example 2), respectively. The surface resistivity of the conductive film was 0.19Ω/□ (Example 8), 0.06Ω/□ (Example 9), 0.03Ω/□ (Example 10) and 0.01Ω/□ (Comparative Example 2), respectively. The volume resistivity of the conductive film was 32.8 µΩ·cm (Example 8), 17.4 µΩ·cm (Example 9), 10.8 µΩ·cm (Example 10) and 7.9 µΩ·cm (Comparative Example 2), respectively. The percentage of Ag in the conductive film was 25.6% by volume (Example 8), 32.7% by volume (Example 9), 43.3% by volume (Example 10) and 54.7% by volume (Comparative Example 2), respectively. The communication range at a frequency of 955 MHz was 3.6 m (Example 8), 4.0 m (Example 9), 4.0 m (Example 10) and 4.2 m (Comparative Example 2), respectively. In Example 8, the resistance deteriorated rate was 100% after the sliding movement was repeated 10 times, 100 times and 500 times, respectively. In Example 9, the resistance deteriorated rate was 100% after the sliding movement was repeated 10 times and 100 times, respectively, and 120% after it was repeated 500 times. In Example 10, the resistance deteriorated rate was 100% after the sliding movement was repeated 10 times, 110% after it was repeated 100 times, and 150% after it was repeated 500 times. In Comparative Example 2, the resistance deteriorated rate was 100% after the sliding movement was repeated 10 times, 350% after it was repeated 100 times, and 1200% after it was repeated 500 times.

The conditions and results in Examples 8-10 and Comparative Example 2 are shown in Tables 1-3.

Examples 11-13

Comparative Examples 3-4

By the same method as that in Examples 1-4 except that the Ag ink was printed at an anilox volume of 20 cc/m² (150 lines/inch) once (Example 11), twice (Example 12), three times (Example 13), four times (Comparative Example 3) and eight times (Comparative Example 4), respectively, a conductive film was obtained, and then, an RFID tag chip-mounted booster antenna and a bending test sample were produced. Then, by the same method as that in Examples 1-4, the thickness, electrical resistance and surface resistivity of the conductive film were measured, and the volume resistivity of the conductive film and the percentage of Ag in the conductive film were calculated. Also, by the same method as that in Examples 1-4, the communication range of the RFID tag chip-mounted booster antenna was measured, and the resistance deteriorated rate of the bending test sample was obtained.

As a result, the thickness of the conductive film was 2.2 µm (Example 11), 3.6 µm (Example 12), 5.6 µm (Example 13), 7.5 µm (Comparative Example 3) and 11.4 µm (Comparative Example 4), respectively. The electrical resistance of the conductive film was 1.6Ω (Example 11), 0.9Ω (Example 12), 0.2Ω (Example 13), 0.2Ω (Comparative Example 3) and 0.2Ω (Comparative Example 4), respectively. The surface resistivity of the conductive film was 0.06Ω/□ (Example 11), 0.02Ω/□ (Example 12), 0.01Ω/□ (Example 13), 0.01Ω/□ (Comparative Example 3) and 0.01Ω/□ (Comparative Example 4), respectively. The volume resistivity of the conductive film was 15.4 µΩ·cm (Example 11), 11.5 µΩ·cm (Example 12), 3.6 g 0 cm (Example 13), 4.8

μΩ·cm (Comparative Example 3) and 7.3 μΩ·cm (Comparative Example 4), respectively. The percentage of Ag in the conductive film was 28.5% by volume (Example 11), 38.5% by volume (Example 12), 49.2% by volume (Example 13), 54.9% by volume (Comparative Example 3) and 70.1% by volume (Comparative Example 4), respectively. The communication range at a frequency of 955 MHz was 3.8 m (Example 11), 4.1 m (Example 12), 4.2 m (Example 13), 4.2 m (Comparative Example 3) and 4.2 m (Comparative Example 4), respectively. In Example 11, the resistance deteriorated rate was 100% after the sliding movement was repeated 10 times, 100 times and 500 times, respectively. In Example 12, the resistance deteriorated rate was 100% after the sliding movement was repeated 10 times and 100 times, respectively, and 125% after it was repeated 500 times. In Example 13, the resistance deteriorated rate was 100% after the sliding movement was repeated 10 times, 150% after it was repeated 100 times, and 180% after it was repeated 500 times. In Comparative Example 3, the resistance deteriorated rate was 200% after the sliding movement was repeated 10 times, 400% after it was repeated 100 times, and 1400% after it was repeated 500 times. Furthermore, in Comparative Example 4, the resistance deteriorated rate was not able to be obtained since the conductive film was broken before the sliding movement was repeated 10 times.

The conditions and results in Examples 11-13 and Comparative Examples 3-4 are shown in Tables 1-3.

Comparative Examples 5-8

First, polyvinyl chloride copolymer latex, polyurethane thickener and propylene glycol were added to the Ag ink used in Examples 1-4, to prepare an Ag ink containing 40% by weight of Ag particles (silver particles having an average particle diameter of 10 nm), 33.8% by weight of polyvinyl chloride copolymer latex, 2.0% by weight of polyurethane thickener and 2.5% by weight of propylene glycol.

By the same method as that in Examples 1-4 except that the Ag ink thus prepared was used to be printed once (Comparative Example 5), twice (Comparative Example 6), three times (Comparative Example 7) and four times (Comparative Example 8), respectively, a conductive film was obtained, and then, an RFID tag chip-mounted booster antenna and a bending test sample were produced. Then, by the same method as that in Examples 1-4, the thickness, electrical resistance and surface resistivity of the conductive film were measured, and the volume resistivity of the conductive film and the percentage of Ag in the conductive film were calculated. Also, by the same method as that in Examples 1-4, the communication range of the RFID tag chip-mounted booster antenna was measured, and the resistance deteriorated rate of the bending test sample was obtained.

As a result, the thickness of the conductive film was 1.5 μm (Comparative Example 5), 2.4 μm (Comparative Example 6), 3.6 μm (Comparative Example 7) and 5.0 μm (Comparative Example 8), respectively. The electrical resistance of the conductive film was not able to be measured due to overload (OL) (Comparative Example 5), 820.0Ω (Comparative Example 6), 185.0Ω (Comparative Example 7) and 70.0 Ω (Comparative Example 8), respectively. The surface resistivity of the conductive film was not able to be measured due to overload (OL) (Comparative Example 5), 114.0Ω/□ (Comparative Example 6), 35.5Ω/□ (Comparative Example 7) and 7.4Ω/□ (Comparative Example 8), respectively. The volume resistivity of the conductive film was not able to be calculated due to overload (OL) (Comparative Example 5), 4280 μΩ·cm (Comparative Example 6), 1705 μΩ·cm (Comparative Example 7) and 1140 μΩ·cm (Comparative Example 8), respectively. The percentage of Ag in the conductive film was 5.7% by volume (Comparative Example 5), 6.4% by volume (Comparative Example 6), 5.9% by volume (Comparative Example 7) and 7.0% by volume (Comparative Example 8), respectively. The communication range at a frequency of 955 MHz was 0.0 m (Comparative Example 5), 0.0 m (Comparative Example 6), 0.7 m (Comparative Example 7) and 1.8 m (Comparative Example 8), respectively. The resistance deteriorated rate was not able to be calculated due to overload (OL) in Comparative Example 5. In Comparative Examples 6-8, the resistance deteriorated rate was 100% after the sliding movement was repeated 10 times, 100 times and 500 times, respectively.

The conditions and results in Comparative Examples 5-8 are shown in Tables 1-3.

Comparative Examples 9-10

By the same method as that in Examples 1-4 except that there were used conductive films (having an Ag percentage of 100% and a size of 100 mm×100 mm) which were cutout of Ag foils (produced by Takeuchi Corporation) having a thickness of 1.0 μm (Comparative Example 9) and 3.0 μm (Comparative Example 10), respectively, in place of the conductive film obtained in Examples 1-4, an RFID tag chip-mounted booster antenna and a bending test sample were produced. Then, by the same method as that in Examples 1-4, the electrical resistance and surface resistivity of the conductive film were measured, and the volume resistivity of the conductive film was calculated. Also, by the same method as that in Examples 1-4, the communication range of the RFID tag chip-mounted booster antenna was measured, and the resistance deteriorated rate of the bending test sample was obtained.

As a result, the electrical resistance of the conductive film was 0.3Ω (Comparative Example 9) and 0.2Ω (Comparative Example 10), respectively. The surface resistivity of the conductive film was 0.01Ω/□ (Comparative Example 9) and 0.01Ω/□ (Comparative Example 10), respectively. The volume resistivity of the conductive film was 1.6 μΩ·cm (Comparative Example 9) and 1.9 μΩ·cm (Comparative Example 10), respectively. The communication range at a frequency of 955 MHz was 3.8 m (Comparative Example 9) and 4.2 m (Comparative Example 10), respectively. In Comparative Example 9, the resistance deteriorated rate was 100% after the sliding movement was repeated 10 times, 200% after it was repeated 100 times, and 800% after it was repeated 500 times. In Comparative Example 10, the resistance deteriorated rate was 100% after the sliding movement was repeated 10 times, 150% after it was repeated 100 times, and 400% after it was repeated 500 times.

The conditions and results in Comparative Examples 9-10 are shown in Tables 1-3.

Comparative Examples 11-13

By the same method as that in Examples 1-4 except that there were used conductive films (having an Al percentage of 100% and a size of 100 mm×100 mm) which were cut out of Al foils (produced by Takeuchi Corporation) having a thickness of 3.0 μm (Comparative Example 11), 6.0 μm (Comparative Example 12) and 12.0 μm (Comparative Example 13), respectively, in place of the conductive film obtained in Examples 1-4, an RFID tag chip-mounted booster antenna and a bending test sample were produced. Then, by the same method as that in Examples 1-4, the electrical resistance and surface resistivity of the conductive film were measured, and the volume resistivity of the conductive film was calculated. Also, by the same method as that in Examples 1-4, the communication range of the RFID tag chip-mounted booster antenna was measured, and the resistance deteriorated rate of the bending test sample was obtained.

As a result, the electrical resistance of the conductive film was 0.3Ω (Comparative Example 11), 0.2Ω (Comparative Example 12) and 0.2Ω (Comparative Example 13), respectively. The surface resistivity of the conductive film was 0.01Ω/□ (Comparative Examples 11-13). The volume resistivity of the conductive film was 3.8 μΩ·cm (Comparative Example 11), 7.6 μΩ·cm (Comparative Example 12) and 15.3 μΩ·cm (Comparative Example 13), respectively. The communication range at a frequency of 955 MHz was 4.2 m (Comparative Example 11), 4.0 m (Comparative Example 12) and 4.0 m (Comparative Example 13), respectively. In Comparative Example 11, the resistance deteriorated rate was 167% after the sliding movement was repeated 10 times, 100% after it was repeated 100 times, and not able to be obtained due to the breaking of the conductive film after it was repeated 500 times. In Comparative Example 12, the resistance deteriorated rate was 100% after the sliding movement was repeated 10 times, 100% after it was repeated 100 times, and 1200% after it was repeated 500 times. In Comparative Example 13, the resistance deteriorated rate was 100% after the sliding movement was repeated 10 times, 100% after it was repeated 100 times, and 800% after it was repeated 500 times.

The conditions and results in Comparative Examples 11-13 are shown in Tables 1-3.

If a booster antenna according to the present invention is used for an RFEI tag, it is possible to produce an RFID tag with a booster antenna having a practical communication range.

The invention claimed is:

1. A booster antenna comprises:
    a substrate; and
    a silver conductive film formed on the substrate, the silver conductive film containing 10-50% by volume of a sintered body of silver particles and having a volume resistivity of 3-100 μΩ·cm and a surface resistivity of 0.43Ω/□ or less.

2. A booster antenna as set forth in claim 1, which has a thickness of 1-6 μm.

3. A method for producing a booster antenna, the method comprising the steps of:
    preparing a silver particle dispersing solution which contains 50-70% by weight of silver particles;
    applying the silver particle dispersing solution on a substrate; and
    calcining the silver particle dispersing solution on the substrate to form a silver conductive film as set forth in claim 1 or 2.

4. A method for producing a booster antenna as set forth in claim 3, wherein said applying of said silver particle dispersing solution on the substrate is carried out by the flexographic printing.

5. A method for producing a booster antenna as set forth in claim 3, wherein said silver particles have an average particle diameter of 20 nm or less.

* * * * *